(12) United States Patent
Kawakami et al.

(10) Patent No.: US 6,534,161 B1
(45) Date of Patent: Mar. 18, 2003

(54) CRYSTALLIZED GLASS COMPOSITION, SINTERED CRYSTALLIZED GLASS COMPACT, AND CIRCUIT SUBSTRATE USING THE SAME

(75) Inventors: Hiromichi Kawakami, Moriyama (JP); Toshiki Tanaka, Otsu (JP); Shizuharu Watanabe, Omihachiman (JP); Hiroshi Takagi, Otsu (JP)

(73) Assignee: Murata Manufacturing Co. Ltd (JP)

( * ) Notice: Subject to any disclaimer, the term of this patent is extended or adjusted under 35 U.S.C. 154(b) by 0 days.

(21) Appl. No.: 09/614,438

(22) Filed: Jul. 12, 2000

(30) Foreign Application Priority Data

Jul. 23, 1999 (JP) ............................................. 11-209300

(51) Int. Cl.$^7$ ................................................. B32B 3/00
(52) U.S. Cl. ........................... 428/210; 501/32; 501/77; 501/108; 501/118; 501/122
(58) Field of Search ...................... 428/210; 501/32, 501/73, 77, 108, 118, 122

(56) References Cited

U.S. PATENT DOCUMENTS

| | | | |
|---|---|---|---|
| 4,764,486 A | * | 8/1988 | Ishihara et al. ................. 501/9 |
| 4,997,795 A | * | 3/1991 | Hang et al. ..................... 501/24 |
| 5,468,694 A | * | 11/1995 | Taguchi et al. ................ 501/77 |
| 5,581,876 A | * | 12/1996 | Prabhu et al. ................. 29/851 |
| 5,958,807 A | * | 9/1999 | Kumar et al. ..................... 501/5 |
| 6,017,642 A | * | 1/2000 | Kumar et al. ................ 428/630 |
| 6,232,251 B1 | * | 5/2001 | Terashi et al. ................... 501/5 |

FOREIGN PATENT DOCUMENTS

DE 19857057 C1 4/2000

OTHER PUBLICATIONS

Schott Glaslexikon; Hein G. Pfaender; 1997; pp.90–93.

* cited by examiner

*Primary Examiner*—Cathy Lam
(74) *Attorney, Agent, or Firm*—Dickstein, Shapiro, Morin & Oshinsky, LLP.

(57) ABSTRACT

A crystallized glass composition contains a principal ingredient comprising $SiO_2$, MgO and $Al_2O_3$ and contains about 2 to 20 parts by weight of $B_2O_3$ relative to 100 parts by weight of the principal ingredient. In a ternary diagram, the weight ratio ($SiO_2$, MgO, $Al_2O_3$) lies within a region surrounded by point A (44.0, 55.0, 1.0), point B (34.5, 64.5, 1.0), point C (35.0, 30.0, 35.0) and point D (44.5, 30.0, 25.5).

9 Claims, 1 Drawing Sheet

CRYSTALLIZED GLASS COMPOSITION, SINTERED CRYSTALLIZED GLASS COMPACT, AND CIRCUIT SUBSTRATE USING THE SAME

BACKGROUND OF THE INVENTION

1. Field of the Invention

The present invention relates to a crystallized glass composition which is suitable for use as an insulating material for various types of circuit substrates, a sintered crystallized glass compact obtained by firing the crystallized glass composition, and a circuit substrate using the same.

2. Description of the Related Art

Recently, various types of electronic apparatuses are rapidly miniaturized and the density thereof is being increased by making use of semiconductor integrated-circuit elements, such as ICs and LSIs. Accordingly, there are demands for smaller and denser circuit substrates for mounting the semiconductor integrated circuit elements, etc., and thereby allowing circuit patterns, such as wiring and electrodes, to be increasingly miniaturized and to develop multilayered circuit patterns. Furthermore, as semiconductor integrated-circuit elements with high speed signals are developed, an increase in the speed of signals propagating through circuit substrates is also demanded.

The speed of signals propagating through wiring, electrodes, etc., in a circuit substrate decreases as the relative dielectric constant of an insulating layer formed in the periphery thereof is increased. That is, in order to increase the speed of signals in the circuit substrate, the relative dielectric constant of the insulating layer must be decreased. As circuit patterns are miniaturized and multilayered circuit patterns are formed, insulating layers which ensure superior insulation reliability are also required.

However, the insulating material for forming an insulating layer having a low relative dielectric constant has a lower thermal coefficient of expansion in comparison with a material for forming a circuit pattern, and also has a lower thermal coefficient of expansion in comparison with a dielectric material for forming a dielectric layer having a high dielectric constant and a substrate material, such as alumina. Therefore, when the circuit material, the dielectric material, the insulating material and the substrate material are simultaneously or sequentially fired, deformation, such as warpage and cracking, may occur due to differences in the thermal coefficient of expansion among the individual materials.

In order to overcome the above problem, for example, Japanese Patent Publication No. 2681216 discloses a circuit substrate provided with a dielectric layer having a high dielectric constant in which an insulating layer is formed using an insulating material with a high thermal coefficient of expansion containing MgO, $SiO_2$ and CaO as principal ingredients. The insulating layer has a thermal coefficient of expansion close to that of the dielectric layer having the high dielectric constant and the circuit pattern, and is obtained by preliminarily firing the insulating material containing MgO, $SiO_2$ and CaO as principal ingredients at 1,000° C. to 1,300° C., and then by firing at 1,240° C. to 1,340° C. so that a principal crystalline phase of $Mg_2SiO_4$, etc., is precipitated.

However, since the insulating material containing MgO, $SiO_2$ and CaO as principal ingredients must be fired at a high temperature of 1,240° C. or more as described above, it is not possible to use low-melting point metals, such as Cu and Ag, as materials for forming circuit patterns. Consequently, although high-melting point metals, such as W and Mo, must be used, these high-melting point metals have high resistivities, and thus the requirement for increasing the speed of signals propagating through circuit substrates is not sufficiently satisfied.

SUMMARY OF THE INVENTION

To overcome the above described problems, preferred embodiments of the present invention provide a crystallized glass composition which can be fired at low temperatures and which has a low relative dielectric constant after firing, superior insulation reliability and a high thermal coefficient of expansion, and to provide a sintered crystallized glass compact obtained by firing the crystallized glass composition. It is another object of the present invention to provide a circuit substrate in which the deformation is decreased and which can satisfactorily cope with high-speed signals.

One preferred embodiment of the present invention provides a crystallized glass composition comprising: a principal ingredient represented by x $SiO_2$+y MgO+z $Al_2O_3$ where x+y+z is 100 parts by weight and the values x, y and z are on lines or within the region enclosed by lines passing through points A (44.0, 55.0, 1.0), B (34.5, 64.5, 1.0), C (35.0, 30.0, 35.0) and D (44.5, 30.0, 25.5) on a ternary diagram thereof; and about 2 to 20 parts by weight of $B_2O_3$ relative to 100 parts by weight of the principal ingredient.

Preferably, the values x, y and z are on lines or within the region enclosed by lines passing through points A (44.0, 55.0, 1.0), B (34.5, 64.5, 1.0), E (35.0, 45.0, 20.0) and F (44.5, 35.5, 20.0) on the ternary diagram thereof.

Preferably, the crystallized glass composition of the present invention contains a forsterite crystalline phase ($Mg_2SiO_4$) and/or an enstatite crystalline phase ($MgSiO_3$) precipitated when fired at or above the crystallization temperature.

Another preferred embodiment of the present invention provides a sintered crystallized glass compact formed by firing the above described crystallized glass composition at or above the crystallization temperature.

Yet another preferred embodiment of the present invention provides a circuit substrate comprising an insulating layer formed by firing the above described crystallized glass composition at or above the crystallization temperature and a circuit pattern.

Preferably, the circuit pattern is composed of an Ag-based conductive material, a Cu-based conductive material or an Au-based conductive material.

With respect to the crystallized glass composition of the present invention, since the weight ratio of the principal ingredient comprising $SiO_2$, MgO, and $Al_2O_3$ lies within the region surrounded by point A, point B, point C and point D in the ternary diagram shown in FIG. 1 and the crystallized glass composition contains about 2 to 20% by weight of $B_2O_3$ relative to the principal ingredient, it is possible to perform firing at a low temperature, for example, at 950° C. or less, and a low relative dielectric constant, superior insulation reliability and a high thermal coefficient of expansion are exhibited after firing.

Since the sintered crystallized glass compact is formed by firing the crystallized glass composition of the present invention at or above the crystallization temperature, even if firing is performed at a low temperature, for example, at 950° C. or less, high sinterability is exhibited, and the sintered crystallized glass compact has a low relative dielectric constant, high insulation reliability and a high thermal coefficient of expansion.

The circuit substrate of the present invention is provided with the insulating layer formed by firing the crystallized glass composition of the present invention at or above the crystallization temperature and the predetermined circuit pattern. Since the insulating layer has substantially the same thermal coefficient of expansion as that of the circuit pattern, the deformation of the substrate, such as warpage and cracking, due to the difference in the thermal coefficient of expansion between the circuit pattern and the insulating layer can be avoided. Since the insulating layer can be fired at a low temperature of 950° C. or less, the Ag-based conductive material, the Cu-based conductive material or the Au-based conductive material having a low resistivity can be used as the material for forming the circuit pattern, and since the insulating layer in itself has a low relative dielectric constant, the speed of signals propagating through the circuit substrate can be increased satisfactorily.

Other features and advantages of the present invention will become apparent from the following description of the invention which refers to the accompanying drawings.

DESCRIPTION OF THE PREFERRED EMBODIMENTS

The crystallized glass composition and the sintered crystallized glass compact of the present invention will be described in detail below.

Figure 1:
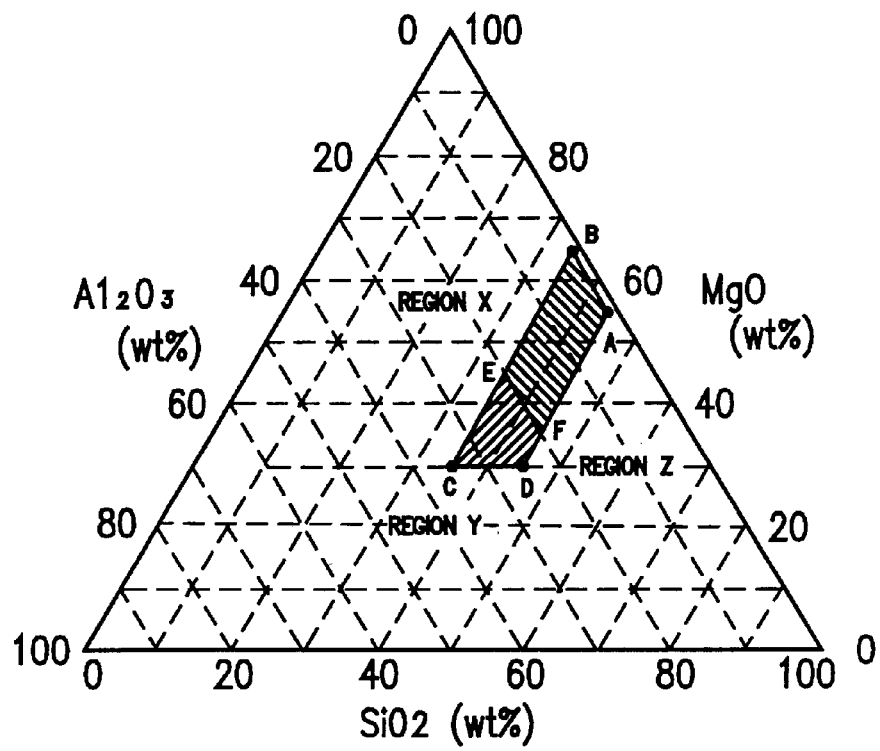
FIG. 1 is a ternary diagram showing the range of the compositional weight ratio with respect to the crystallized glass composition of the present invention.

With respect to the crystallized glass composition of the present invention, the weight ratio ($SiO_2$, MgO, $Al_2O_3$) of the principal ingredient lies within a region surrounded by point A (44.0, 55.0, 1.0), point B (34.5, 64.5, 1.0), point C (35.0, 30.0, 35.0) and point D (44.5, 30.0, 25.5) in the ternary diagram shown in FIG. 1, and the crystallized glass composition contains about 2 to 20 parts by weight of $B_2O_3$ relative to 100 parts by weight of the principal ingredient. The crystallized glass composition can be fired with good sinterability at a low temperature of 950° C. or less, and after firing, the resultant sintered crystallized glass compact has a relative dielectric constant as low as 7 or less, high insulation reliability at an insulation resistance (log IR) of 9 or more and a high thermal coefficient of expansion of 6 ppm/° C. or more.

In contrast, in a region X, in which the weight ratio of the principal ingredient lies outside the region surrounded by point A, point B, point C and point D in the ternary diagram shown in FIG. 1, the degree of crystallinity during sintering is increased and the softening and flowing properties are decreased, and thus sufficient sinterability cannot be obtained. In a region Y, which is also out of the range, the thermal coefficient of expansion is decreased, for example, to less than 6 ppm/° C. The reason for this is that in the region Y, crystalline phases having a high thermal coefficient of expansion, such as forsterite and enstatite, are not substantially present, or cordierite having a low thermal coefficient of expansion tends to be precipitated. In a region Z, which is also out of the range, the sinterability is decreased at a firing temperature of 950° C. or less, at which it is difficult to substantially perform firing. The reason for this is that the crystallized glass composition does not soften or flow sufficiently. In the present invention, when the principal ingredient does not contain $Al_2O_3$, it is difficult to perform sintering at a firing temperature of 950° C. or less. The reason for this is that when the principal ingredient is produced, in particular, when a mixture of glass raw materials is quenched, glass formation does not sufficiently occur.

If the $B_2O_3$ content is less than about 2% by weight, sufficient sinterability cannot be obtained at 950° C. or less. The reason for this is that the crystallized glass composition does not soften or flow sufficiently during firing. On the other hand, if the $B_2O_3$ content exceeds about 20% by weight, the thermal coefficient of expansion is decreased to less than 6 ppm/° C.

In the crystallized glass composition of the present invention, in the ternary diagram shown in FIG. 1, the weight ratio ($SiO_2$, MgO, $Al_2O_3$) of the principal ingredient preferably lies within a region surrounded by point A (44.0, 55.0, 1.0), point B (34.5, 64.5, 1.0), point E (35.0, 45.0, 20.0) and point F (44.5, 35.5, 20.0). When the weight ratio of the principal ingredient is within such a range, the thermal coefficient of expansion of the resultant sintered compact can be increased to 7 ppm/° C. or more.

In the crystallized glass composition of the present invention, a forsterite crystalline phase and/or an enstatite crystalline phase are preferably precipitated when the crystallized glass composition is fired at or above the glass crystallization temperature (specifically, at 800 to 900° C.). The sintered crystallized glass compact in which the forsterite and enstatite crystalline phases are precipitated has sufficiently high sinterability even at a firing temperature of 950° C. or less, and has a low relative dielectric constant, high insulation reliability and a high thermal coefficient of expansion. More preferably, both of the forsterite crystalline phase and the enstatite crystalline phase are precipitated because the above characteristics are further improved.

Additionally, the crystallized glass composition of the present invention is produced, for example, in a method in which starting materials, such as $SiO_2$, $MgCO_3$, $Al_2O_3$ and $H_3BO_3$ are mixed so as to satisfy a predetermined weight compositional ratio, the mixture is melted, the resultant molten glass is quenched in water and then grinding is performed. When crystalline phases other than the forsterite and enstatite crystalline phases are precipitated in the solidified glass, for example, when the cordierite crystalline phase and the like are precipitated, the thermal coefficient of expansion of the resultant sintered compact tends to be decreased. Therefore, preferably, the forsterite crystalline phase and the enstatite crystalline phase are precipitated after the molten glass is quenched.

The crystallized glass composition of the present invention may be formed as a paste by being mixed with an organic vehicle, etc. Alternatively, a slurry containing the powdered crystallized glass of the present invention may be formed like a sheet. The vehicle may contain conventional organic resins, organic solvents, plasticizers, dispersing agents, and so on.

Next, a circuit substrate in an embodiment of the present invention will be described.

Figure 2:
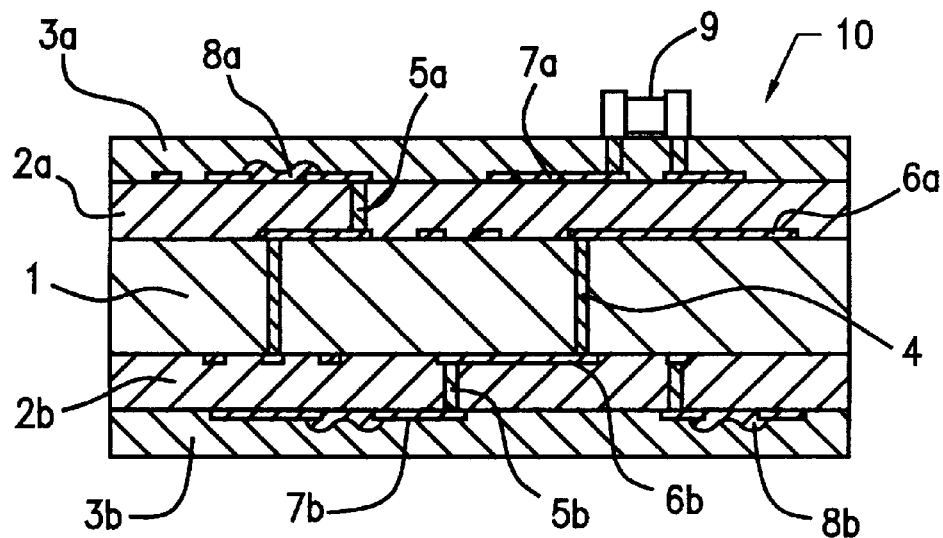
FIG. 2 is a sectional view which schematically shows a circuit substrate in an embodiment of the present invention.

In a circuit substrate 10 shown in FIG. 2, insulating layers 2a and 2b formed by firing the crystallized glass composition of the present invention are provided on both principal surfaces of a substrate 1 composed of alumina, a low-temperature-sinterable ceramic, or the like, and protective films 3a and 3b composed of glass or the like are further deposited thereon. Specifically, circuit patterns 6a and 6b are formed on both principal surfaces of the substrate 1, and the circuit patterns 6a and 6b are electrically connected to each other through a via-hole 4. Circuit patterns 7a and 7b and thick-film resistors 8a and 8b are formed on the outer surfaces of the insulating layers 2a and 2b, respectively, and the protective films 3a and 3b for protecting the individual circuit patterns and thick-film resistors are formed on the insulating layers 2a and 2b. In the circuit substrate 10, the circuit patterns 6a, 6b, 7a, and 7b and the via-holes 4, 5a, and 5b, together with the thick-film resistors 8a and 8b and a surface mount device 9, constitute a predetermined circuit.

Next, an example of a method of fabricating the circuit substrate 10 will be described.

First, a ceramic green sheet for the substrate provided with the via-hole 4 is prepared, and the circuit patterns 6a and 6b are formed by screen-printing a conductive paste on both principal surfaces of the ceramic green sheet for the substrate. On other ceramic green sheets for the insulating layers, which are formed using a slurry in which the crystallized glass composition of the present invention is dispersed in an organic vehicle, the circuit patterns 7a and 7b are formed by screen-printing or the like of a conductive paste.

The ceramic green sheets for the insulating layers provided with the circuit patterns 7a and 7b are deposited on both principal surfaces of the ceramic green sheet for the substrate provided with the circuit patterns 6a and 6b. The thick-film resistors 8a and 8b are then printed at the predetermined positions on the ceramic green sheets for the insulating layers, and the ceramic green sheet for the substrate and the ceramic green sheets for the insulating layers are integrally fired at 950° C. or less. Next, on both principal surfaces of a laminate which has been integrally fired, a glass paste for the protective films is printed, and the via-holes are formed, followed by firing. Various types of the surface mount devices 9 are mounted, and thus the circuit substrate 10 is obtained.

In accordance with the embodiment shown in FIG. 2, the insulating layers 2a and 2b are formed by firing the crystallized glass composition of the present invention at or above the crystallization temperature, and have substantially the same high thermal coefficient of expansion as that of the circuit patterns 6a, 6b, 7a, and 7b. Thereby, warpage, cracking, etc., caused by the difference in the thermal coefficient of expansion between the circuit patterns and the insulating layers can be suppressed, and the resultant circuit substrate 10 has decreased deformation and higher accuracy. In general, the circuit patterns composed of an Ag-based conductive material have a thermal coefficient of expansion of approximately 20 ppm/° C., and the circuit patterns composed of a Cu-based conductive material have a thermal coefficient of expansion of approximately 15 ppm/° C.

The insulating layers 2a and 2b can be fired at a low temperature of 950° C. or less, and as the material for forming the circuit patterns 6a, 6b, 7a, and 7b, an Ag-based conductive material, a Cu-based conductive material or an Au-based conductive material, having a low resistivity can be used, and also, as described above, the insulating layers in themselves have a low relative dielectric constant. Thereby, the circuit substrate 10 can satisfactorily cope with the higher speed signals in the surface mount devices such as semiconductor integrated-circuit elements. Furthermore, since the insulating layers 2a and 2b have superior insulation reliability, the high-performance circuit substrate 10 in which the circuit patterns 6a, 6b, 7a, and 7b are miniaturized and formed in a multilayered structure is obtained.

Although the embodiment of the present invention is described above, the circuit substrate of the present invention is not limited to the embodiment described above.

For example, the circuit substrate 10 may be produced by a sequential firing method, in which a conductive paste is baked on both principal surfaces of the substrate 1 composed of an alumina substrate, a paste containing the crystallized glass composition of the present invention is screen-printed thereon, followed by firing to form the insulating layers 2a and 2b, and then a conductive paste and thick-film resistors are baked, and the protective films 3a and 3b are formed. In particular, when the substrate 1 is composed of an alumina substrate, it has a thermal coefficient of expansion of 7 to 8 ppm/° C., and thus matching with the insulating layers 2a and 2b having a thermal coefficient of expansion of 6 ppm/° C. is improved, resulting in a circuit substrate having decreased deformation and higher accuracy.

Additionally, the circuit substrate of the present invention may be applicable to a substrate for functional devices such as LC filters, a substrate for functional modules such as voltage-controlled oscillators, a substrate for functional packages such as hybrid ICs and multichip modules, and various other types of circuit substrates.

EXAMPLES

The present invention will be described based on the specific examples.

First, as starting materials for crystallized glass compositions, $SiO_2$, $MgCO_3$, $Al_2O_3$ and $H_3BO_3$ were prepared and mixed so as to satisfy the compositions shown in Table 1 below. Next, the resultant mixtures were melted at the temperatures shown in Table 1 to produce a molten glass. The molten glass was quenched in pure water, followed by grinding, and thus various types of glass powder represented by Sample Nos. a to y was obtained.

TABLE 1

| Sample No. | Glass Composition (% by weight) | | | | Melting temperature (° C.) | Remarks |
| --- | --- | --- | --- | --- | --- | --- |
| | $SiO_2$ | MgO | $Al_2O_3$ | $B_2O_3$ | | |
| a | 44.0 | 55.0 | 1.0 | 10.0 | 1,650 | Point A |
| b | 34.5 | 64.5 | 1.0 | 10.0 | 1,650 | Point B |
| c | 35.0 | 30.0 | 35.0 | 10.0 | 1,650 | Point C |
| d | 44.5 | 30.0 | 25.5 | 10.0 | 1,650 | Point D |
| e | 35.0 | 45.0 | 20.0 | 10.0 | 1,650 | Point E |
| f | 45.5 | 35.5 | 20.0 | 10.0 | 1,650 | Point F |
| g | 40.0 | 50.0 | 10.0 | 10.0 | 1,650 | |
| h | 40.0 | 35.0 | 25.0 | 10.0 | 1,650 | |
| i | 30.0 | 60.0 | 10.0 | 10.0 | 1,650 | out of range |
| j | 20.0 | 40.0 | 40.0 | 10.0 | 1,650 | out of range |
| k | 40.0 | 20.0 | 40.0 | 10.0 | 1,650 | out of range |
| l | 55.0 | 40.0 | 5.0 | 10.0 | 1,650 | out of range |
| m | 34.5 | 64.5 | 1.0 | 0.0 | 1,650 | out of range |
| n | 34.5 | 64.5 | 1.0 | 2.0 | 1,650 | |
| o | 34.5 | 64.5 | 1.0 | 20.0 | 1,650 | |
| p | 34.5 | 64.5 | 1.0 | 30.0 | 1,650 | out of range |
| q | 40.0 | 50.0 | 10.0 | 0.0 | 1,650 | out of range |
| r | 40.0 | 50.0 | 10.0 | 2.0 | 1,650 | |
| s | 40.0 | 50.0 | 10.0 | 20.0 | 1,650 | |
| t | 40.0 | 50.0 | 10.0 | 30.0 | 1,650 | out of range |
| u | 35.0 | 30.0 | 35.0 | 0.0 | 1,650 | out of range |
| v | 35.0 | 30.0 | 35.0 | 2.0 | 1,650 | |
| w | 35.0 | 30.0 | 35.0 | 20.0 | 1,650 | |
| x | 35.0 | 30.0 | 35.0 | 30.0 | 1,650 | out of range |
| y | 40.0 | 60.0 | 0.0 | 0.0 | 1,650 | out of range |

Next, an organic binder, a solvent, a plasticizer, etc., were added to each type of glass powder represented by Sample Nos. a to y, and the mixture was thoroughly blended in a ball mill so as to be homogeneously dispersed. Defoaming was then performed at reduced pressure to obtain a slurry for a green sheet. Any conventional organic vehicles, such as organic binders, solvents, and plasticizers, may be used and there is no specific limitation to the ingredients thereof.

Using the slurry, a green sheet at a thickness of 0.2 mm was formed on a film using a doctor blade by casting. The green sheet was dried and detached from the film, and a similar sintered crystallized glass compact was subjected to X-ray diffraction analysis, and the precipitated crystalline phase was identified by the X-ray diffraction pattern of the surface of the specimen.

The evaluation results are shown in Table 2 below.

TABLE 2

| Example | Sample No. | Relative dielectric constant $\epsilon r$ | Insulation resistance logIR | Thermal coefficient of expansion ppm/° C. | Sinterability | Precipitated crystalline phase | |
|---|---|---|---|---|---|---|---|
| | | | | | | Forsterite | Enstatite |
| 1 | a | 6.7 | >9 | 13.1 | good | observed | observed |
| 2 | b | 6.8 | >9 | 14.0 | good | observed | observed |
| 3 | c | 6.7 | >9 | 6.5 | good | observed | observed |
| 4 | d | 6.6 | >9 | 6.7 | good | observed | observed |
| 5 | e | 6.6 | >9 | 7.9 | good | observed | observed |
| 6 | f | 6.6 | >9 | 7.8 | good | observed | observed |
| 7 | g | 6.7 | >9 | 8.6 | good | observed | observed |
| 8 | h | 6.8 | >9 | 6.8 | good | observed | observed |
| 9 | i | — | — | — | failure | — | — |
| 10 | j | 7.1 | >9 | 5.3 | good | not observed | observed |
| 11 | k | 6.7 | >9 | 4.9 | good | observed | observed |
| 12 | l | — | — | — | failure | — | — |
| 13 | m | — | — | — | failure | — | — |
| 14 | n | 6.9 | >9 | 14.5 | good | observed | observed |
| 15 | o | 6.5 | >9 | 12.0 | good | observed | observed |
| 16 | p | 6.3 | >9 | 9.9 | good | observed | observed |
| 17 | q | — | — | — | failure | — | — |
| 18 | r | 6.8 | >9 | 9.1 | good | observed | observed |
| 19 | s | 6.5 | >9 | 8.0 | good | observed | observed |
| 20 | t | 6.2 | >9 | 7.8 | good | observed | observed |
| 21 | u | — | — | — | failure | — | — |
| 22 | v | 6.8 | >9 | 6.7 | good | observed | observed |
| 23 | w | 6.3 | >9 | 6.1 | good | observed | observed |
| 24 | x | 6.2 | >9 | 5.8 | good | observed | observed |
| 25 | y | — | — | — | failure | — | — | green sheet having a predetermined size was obtained by die cutting. A plurality of layers of the green sheet were pressed together to form a green crystallized glass compact.

The green crystallized glass compact was heated at a rate of 200° C./hour and was fired at 950° C. for 2 hours, and thus sintered crystallized glass compacts represented by Examples 1 to 25 shown in Table 2 below were obtained. Evaluations were made with respect to the relative dielectric constant $\epsilon r$, the insulation resistance value log IR, the thermal coefficient of expansion, and the precipitated crystalline phase for each of the sintered crystallized glass compacts of Examples 1 to 25.

In order to evaluate the relative dielectric constant $\epsilon r$, an Ag-based electrode with a size of 8 mm×8 mm was applied to each principal surface of the sintered crystallized glass compact with a size of 10 mm×10 mm×0.5 mm, followed by baking. The capacitance between both electrodes was measured by a LCR meter at a frequency of 1 MHZ, a voltage of 1 Vrms and a temperature of 25° C., and the relative dielectric constant $\epsilon r$ was derived from the capacitance obtained. In order to evaluate the insulation resistance value log IR, 50 V DC was applied to the similar sintered crystallized glass compact, and the logarithm of a measured value IR after 60 seconds was obtained. In order to evaluate the thermal coefficient of expansion, with respect to the sintered crystallized glass compact with a size of 2 mm×2 mm×10 mm, an average thermal coefficient of expansion in the temperature range of 30° C. to 400° C. was obtained. In order to evaluate the precipitated crystalline phase, the As is obvious from Table 2, with respect to the sintered crystallized glass compacts of Examples 1 to 8, Examples 14 and 15, Examples 18 and 19 and Examples 22 to 23, in which the weight ratio ($SiO_2$, MgO, $Al_2O_3$) of the principal ingredient lay within a region surrounded by point A (44.0, 55.0, 1.0), point B (34.5, 64.5, 1.0), point C (35.0, 30.0, 35.0), and point D (44.5, 30.0, 25.5) in the ternary diagram shown in FIG. 1, and in which about 2 to 20 parts by weight of $B_2O_3$ relative to 100 parts by weight of the principal ingredient were contained, the sinterability was satisfactory even when fired at a relatively low temperature of 950° C. or less, and also the low dielectric constant, superior insulation reliability and the high thermal coefficient of expansion were observed.

Specifically, with respect to the sintered crystallized glass compacts of Examples 1 to 8, Examples 14 and 15, Examples 18 and 19 and Examples 22 to 23, at least one of forsterite ($Mg_2SiO_4$) and enstatite ($MgSiO_3$) were precipitated, the thermal coefficient of expansion was 6 ppm/° C. or more, the relative dielectric constant was 7 or less and high insulation reliability was observed. The dense sintered crystallized glass compacts were formed by quenching molten glass of the crystallized glass compositions at 950° C. or less. Furthermore, forsterite and enstatite having a high thermal coefficient of expansion were precipitated efficiently, the sintered crystallized glass compacts having a low dielectric constant with a relative dielectric constant $\epsilon r$ of 7 or less and a high thermal coefficient of expansion of 6 ppm/° C. or more were obtained.

However, when the cordierite crystalline phase and the like were precipitated in the solids after the molten glass was quenched, the above conditions were not achieved. For example, when the crystallized glass powder of the Sample No. h was exposed to the precipitation temperature of cordierite, the cordierite crystalline phase was precipitated and the thermal coefficient of expansion became less than 6 ppm/° C.

As is obvious from Example 1, Example 3, Examples 5 to 7, Examples 14 and 15 and Examples 18 and 19, when the weight ratio ($SiO_2$, MgO, $Al_2O_3$) of the principal ingredient lay within a region surrounded by point A (44.0, 55.0, 1.0), point B (34.5, 64.5, 1.0), point E (35.0, 45.0, 20.0), and point F (44.5, 35.5, 20.0) in the ternary diagram shown in FIG. 1, and in which about 2 to 20 parts by weight of $B_2O_3$ relative to 100 parts by weight of the principal ingredient were contained, either forsterite or enstatite was precipitated, the thermal coefficient of expansion was 7 ppm/° C. or more, the relative dielectric constant was 7 or less and high insulation reliability was achieved.

In contrast, in the region X in the ternary diagram shown in FIG. 1, as is obvious from Example 9, the degree of crystallinity during sintering was increased, softening and flowing insufficiently occurred, and it was not possible to sufficiently perform firing at 950° C. or less. In the region Y, as is obvious from Examples 10 and 11, the thermal coefficient of expansion was less than 6 ppm/° C. The reason for this is that in the region Y the amounts of forsterite and enstatite precipitated were decreased, or cordierite having a low thermal coefficient of expansion was precipitated. In the region Z, as is obvious from Example 12, sintering was not possible at 950° C. or less. This was mainly because of the fact that softening and flowing for forming a satisfactory sintered compact did not occur sufficiently due to an excessive amount of $SiO_2$ in the crystallized glass composition. As is also obvious from Example 25, when $Al_2O_3$ was not contained, sintering was not possible at 950° C. or less. The reason for this is that the solid obtained when molten glass was quenched was not sufficiently vitrified.

When the $B_2O_3$ content was less than about 2 parts by weight relative to 100 parts by weight of the principal ingredient comprising $SiO_2$, MgO and $Al_2O_3$, as is obvious from Examples 13, 17 and 21, sintering was not possible at 950° C. or less. This was because of the fact that softening and flowing for forming a satisfactory sintered compact did not sufficiently occur. On the other hand, when the $B_2O_3$ content exceeded about 20 parts by weight, as in Examples 16 and 20, the resistance to moisture of the glass powder was easily deteriorated, and pores easily occurred after sintering.

As described above, the crystallized glass composition of the present invention can be fired at a low temperature, for example, at 950° C. or less, and after firing, a low relative dielectric constant of 7 or less, superior insulation reliability and a high thermal coefficient of expansion of 6 ppm/° C. are exhibited.

The sintered crystallized glass compact of the present invention is dense and has high sinterability, a low relative dielectric constant of 7 or less, superior insulation reliability and a high thermal coefficient of expansion of 6 ppm/° C. even when firing was performed at a low temperature, for example, at 950° C. or less.

In the circuit substrate of the present invention, the insulating layer has substantially the same thermal coefficient of expansion as that of the circuit patterns, and the deformation of the substrate, such as warpage and cracking, due to the difference in the thermal coefficient of expansion can be avoided. Thereby, the circuit substrate has high accuracy. Since firing can be performed at 950° C. or less, an Ag-based conductive material, a Cu-based conductive material or an Au-based conductive material can be used as the material for forming the circuit patterns. Since the insulating layer in itself has a low relative dielectric constant, the speed of signals propagating through the circuit substrate can be increased.

While the invention has been particularly shown and described with reference to preferred embodiments thereof, it will be understood by those skilled in the art that the forgoing and other changes in form and details may be made therein without departing from the spirit of the invention.

What is claimed is:

1. A crystallized glass composition comprising:
a principal ingredient represented by x $SiO_2$+y MgO+z $Al_2O_3$ where x+y+z is 100 parts by weight and the values x, y and z are on lines or within the region enclosed by lines passing through points A (44.0, 55.0, 1.0), B (34.5, 64.5, 1.0), C (35.0, 30.0, 35.0) and D (44.5, 30.0, 25.5) on a ternary diagram thereof; and
about 2 to 20 parts by weight of $B_2O_3$ relative to 100 parts by weight of the principal ingredient the crystallized glass composition further contains both a forsterite crystalline phase and an enstatite crystalline phase.

2. The crystallized glass composition according to claim 1, wherein the values x, y and z are on lines or within the region enclosed by lines passing through points A (44.0, 55.0, 1.0), B (34.5, 64.5, 1.0), E (35.0, 45.0, 20.0) and F (44.5, 35.5, 20.0) on the ternary diagram thereof.

3. A circuit substrate arrangement comprising a substrate having an insulating layer of crystallized glass composition according to claim 2 thereon.

4. The circuit substrate arrangement according to claim 3 having a circuit pattern on the insulating layer.

5. The circuit substrate according to claim 4, wherein the circuit pattern comprises a conductor comprising Ag, Cu or Au.

6. A sintered crystallized glass compact formed by firing the crystallized glass composition according to claim 1 at or above the crystallization temperature.

7. A circuit substrate arrangement comprising a substrate having an insulating layer of crystallized glass composition according to claim 1 thereon.

8. The circuit substrate arrangement according to claim 7 having a circuit pattern on the insulating layer.

9. The circuit substrate according to claim 8, wherein the circuit pattern comprises a conductor comprising Ag, Cu or Au.

* * * * *